(12) United States Patent
Kim et al.

(10) Patent No.: US 10,944,070 B2
(45) Date of Patent: Mar. 9, 2021

(54) DISPLAY DEVICE HAVING CURVED SHAPE

(71) Applicant: SAMSUNG DISPLAY CO., LTD., Yongin-si (KR)

(72) Inventors: Dongho Kim, Seoul (KR); Youngjin Ko, Hwaseong-si (KR); Minsoo Kim, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 4 days.

(21) Appl. No.: 15/885,439

(22) Filed: Jan. 31, 2018

(65) Prior Publication Data

US 2018/0219176 A1   Aug. 2, 2018

(30) Foreign Application Priority Data

Jan. 31, 2017 (KR) .................. 10-2017-0014119

(51) Int. Cl.
*H01L 51/52* (2006.01)
*H01L 27/32* (2006.01)
*H01L 51/00* (2006.01)

(52) U.S. Cl.
CPC ...... *H01L 51/5246* (2013.01); *H01L 27/3244* (2013.01); *H01L 51/0097* (2013.01); *H01L 27/3241* (2013.01); *H01L 51/5253* (2013.01); *H01L 2251/5338* (2013.01); *Y02E 10/549* (2013.01)

(58) Field of Classification Search
CPC ............. H01L 51/5246; H01L 27/3244; H01L 51/0097

See application file for complete search history.

(56) References Cited

U.S. PATENT DOCUMENTS

| | | | |
|---|---|---|---|
| 9,564,079 B2 | 2/2017 | Namkung | |
| 2005/0162587 A1 | 7/2005 | Jeon | |
| 2009/0096965 A1* | 4/2009 | Nagata | G02F 1/133305 349/103 |
| 2012/0025700 A1* | 2/2012 | Ryu | H01L 51/5243 313/512 |
| 2014/0307395 A1* | 10/2014 | An | G06F 1/1652 361/749 |
| 2016/0037625 A1* | 2/2016 | Huitema | H05K 1/028 361/749 |
| 2016/0084994 A1* | 3/2016 | Namkung | G02B 1/14 345/173 |
| 2018/0329367 A1* | 11/2018 | Kuwabara | G04G 17/06 |

FOREIGN PATENT DOCUMENTS

| | | |
|---|---|---|
| KR | 10-0555414 B1 | 2/2006 |
| KR | 10-2012-0004119 A | 1/2012 |
| KR | 10-2015-0015256 A | 2/2015 |

* cited by examiner

*Primary Examiner* — Lex H Malsawma
*Assistant Examiner* — Xia L Cross
(74) *Attorney, Agent, or Firm* — Lewis Roca Rothgerber Christie LLP (57) ABSTRACT

A display device having improved reliability includes: a display panel including a substrate and an encapsulation layer, the substrate including a display area and a non-display area, and the encapsulation layer being located on the substrate at the display area; and a window on the display panel, and the substrate has a convex shape and has a plurality of first grooves arranged at an outer circumferential surface of the substrate.

27 Claims, 8 Drawing Sheets

DISPLAY DEVICE HAVING CURVED SHAPE

CROSS-REFERENCE TO RELATED APPLICATION

This application claims priority to and the benefit of Korean Patent Application No. 10-2017-0014119, filed on Jan. 31, 2017 in the Korean Intellectual Property Office (KIPO), the entire disclosure of which is incorporated by reference herein.

BACKGROUND

1. Field

Aspects of embodiments of the present invention relate to a display device.

2. Discussion of Related Art

Display devices display images by using elements that emit light. In recent times, flat panel display devices are widely in use as display devices. Flat panel display devices are classified into liquid crystal display ("LCD") devices, organic light emitting diode ("OLED") display devices, plasma display panel ("PDP") display devices, electrophoretic display devices, and the like based on a light emitting scheme thereof.

In recent times, flexible display panels that are bendable are being developed. Such flexible display panels may be used in various fields because they may be used in a folded or curved form. Organic light emitting elements are attracting attention as display elements of such flexible display panels because they may be manufactured into a stack structure of a thin film type to have excellent flexibility.

Such display devices may have a dome shape. In order to form a dome-shaped display device, a laminating process is performed in which a display panel and a window are pressed. In such an exemplary embodiment, the display panel may be subjected to stress due to deformation, and, thus, defects such as cracks, shrinkage, and bubbles may occur at an edge area of the display panel.

It is to be understood that this background of the technology section is intended to provide useful background for understanding the technology and, as such, disclosed herein, the technology background section may include ideas, concepts, or recognitions that were not part of what was known or appreciated by those skilled in the pertinent art prior to a corresponding effective filing date of subject matter disclosed herein.

SUMMARY

According to an aspect of embodiments of the present invention, a display device has improved reliability by substantially minimizing defects occurring at an edge area of the display device.

According to one or more exemplary embodiments, a display device includes: a display panel including a substrate and an encapsulation layer, the substrate including a display area and a non-display area, and the encapsulation layer being located on the substrate at the display area; and a window on the display panel. The substrate may have a convex shape and may have a plurality of first grooves arranged at an outer circumferential surface of the substrate.

The display panel may have a circular shape, an elliptical shape, or a polygonal shape on a plane.

The display panel may have a dome shape.

A distance between two edges defined by the first groove at the outer circumferential surface of the substrate may be less than a depth of the first groove on a plane.

Each of the plurality of first grooves may be disposed at equal intervals along the outer circumferential surface of the substrate.

Each of the plurality of first grooves may have at least one of a circular shape, an elliptical shape, a semicircular shape, a polygonal shape, and a combined shape thereof on a plane.

The plurality of first grooves may be arranged across the display area.

The display panel may further include a protective film below the substrate.

The protective film may have a plurality of second grooves.

The plurality of second grooves may correspond to the plurality of first grooves, respectively.

A distance between two edges defined by the second groove at an outer circumferential surface of the protective film may be less than a depth of the second groove on a plane.

Each of the plurality of second grooves may be disposed at equal intervals.

The protective film may have a same shape as a shape of the substrate.

The protective film may have a planar area smaller than a planar area of the substrate.

The encapsulation layer may have a planar area smaller than a planar area of the substrate.

According to one or more exemplary embodiments, a display device includes: a display panel including a substrate and an encapsulation layer, the substrate including a display area and a non-display area, and the encapsulation layer being located on the substrate at the display area; and a window on the display panel. The substrate may have a convex shape and may have a plurality of holes arranged at the non-display area.

The display panel may have a circular shape, an elliptical shape, or a polygonal shape on a plane.

The display panel may have a dome shape.

Each of the plurality of holes may have at least one of a circular shape, an elliptical shape, a semicircular shape, a polygonal shape, and a combined shape thereof on a plane.

The plurality of holes may be arranged across the display area.

The display panel may further include a protective film below the substrate.

The protective film may have a same shape as a shape of the substrate.

The protective film may have a planar area smaller than a planar area of the substrate.

According to one or more exemplary embodiments, a display device includes: a display panel including a substrate, an encapsulation layer, and a protective film, the substrate including a display area and a non-display area, the encapsulation layer being located on the substrate at the display area, and the protective film being located below the substrate; and a window on the display panel. The substrate may have a convex shape, and the protective film may have a planar area smaller than a planar area of the substrate.

The protective film may be arranged apart from an outer circumferential surface of the substrate.

The display panel may have a circular shape, an elliptical shape, or a polygonal shape on a plane.

The display panel may have a dome shape.

The foregoing is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

A more complete appreciation of the present invention will become more apparent by describing in further detail some exemplary embodiments thereof with reference to the accompanying drawings, wherein.

DETAILED DESCRIPTION

Some exemplary embodiments will now be described more fully herein with reference to the accompanying drawings. Although the present invention may be modified in various manners and have several exemplary embodiments, some exemplary embodiments are illustrated in the accompanying drawings and will be mainly described in the specification. However, the scope of the present invention is not limited to the exemplary embodiments shown and described and should be construed as including all changes, equivalents, and substitutions included in the spirit and scope of the invention.

In the drawings, thicknesses of layers and areas may be illustrated in an enlarged manner for clarity and ease of description thereof. When a layer, area, or plate is referred to as being "on" another layer, area, or plate, it may be directly on the other layer, area, or plate, or one or more intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or one or more intervening layers, areas, or plates may be present therebetween. Conversely, when a layer, area, or plate is referred to as being "directly below" another layer, area, or plate, intervening layers, areas, or plates may be absent therebetween.

The spatially relative terms "below," "beneath," "lower," "above," "upper," and the like, may be used herein for ease of description to describe the relations between one element or component and another element or component as illustrated in the drawings. It is to be understood that the spatially relative terms are intended to encompass different orientations of the device in use or operation, in addition to the orientation depicted in the drawings. For example, in the case in which a device illustrated in the drawings is turned over, the device positioned "below" or "beneath" another device may be placed "above" another device. Accordingly, the illustrative term "below" may include both the lower and upper positions. The device may also be oriented in the other direction and, thus, the spatially relative terms may be interpreted differently depending on the orientations.

Throughout the specification, when an element is referred to as being "connected" to another element, the element may be "directly connected" to the other element, or "electrically connected" to the other element with one or more intervening elements interposed therebetween. It is to be further understood that the terms "comprises," "including," "includes," and/or "including," when used in this specification, specify the presence of stated features, integers, steps, operations, elements, and/or components, but do not preclude the presence or addition of one or more other features, integers, steps, operations, elements, components, and/or groups thereof.

It is to be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately," as used herein, are inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations, or within ±30%, 20%, 10%, or 5% of the stated value.

Unless otherwise defined, all terms used herein (including technical and scientific terms) have the same meaning as commonly understood by those skilled in the art to which the present invention pertains. It is to be further understood that terms, such as those defined in commonly used dictionaries, should be interpreted as having a meaning that is consistent with their meaning in the context of the relevant art and are not to be interpreted in an ideal or excessively formal sense unless clearly defined in the present specification.

Some of the parts which are not associated with the description may not be provided in order to specifically describe embodiments of the present invention, and like reference numerals refer to like elements throughout the specification.

Herein, an exemplary embodiment of the present invention will be described with reference to FIGS. 1, 2, 3, 4, and 5.

Figure 1:
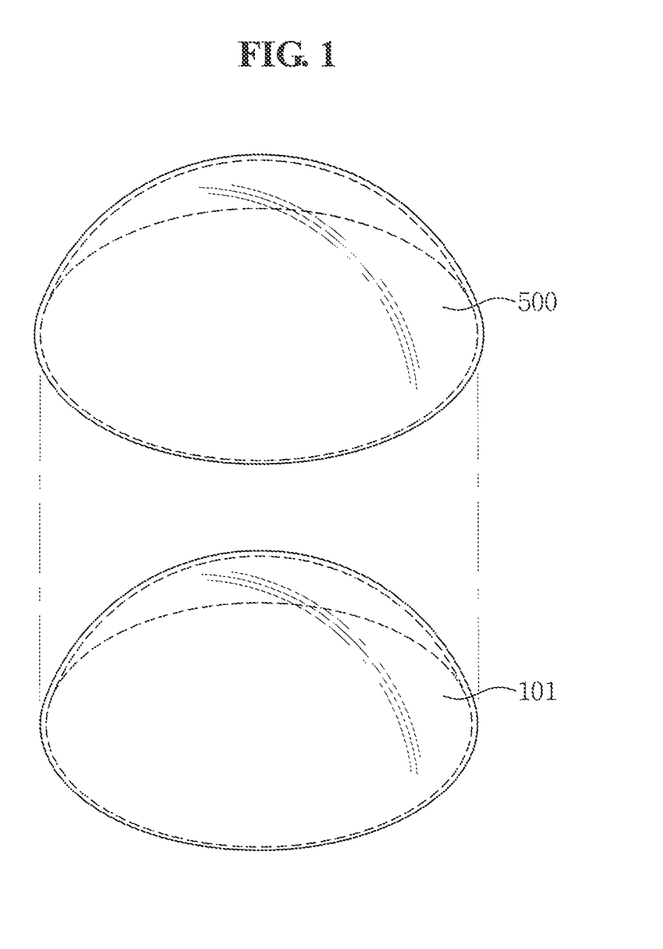
FIG. 1 is a schematic exploded perspective view illustrating a display device according to an exemplary embodiment.
Figure 2:
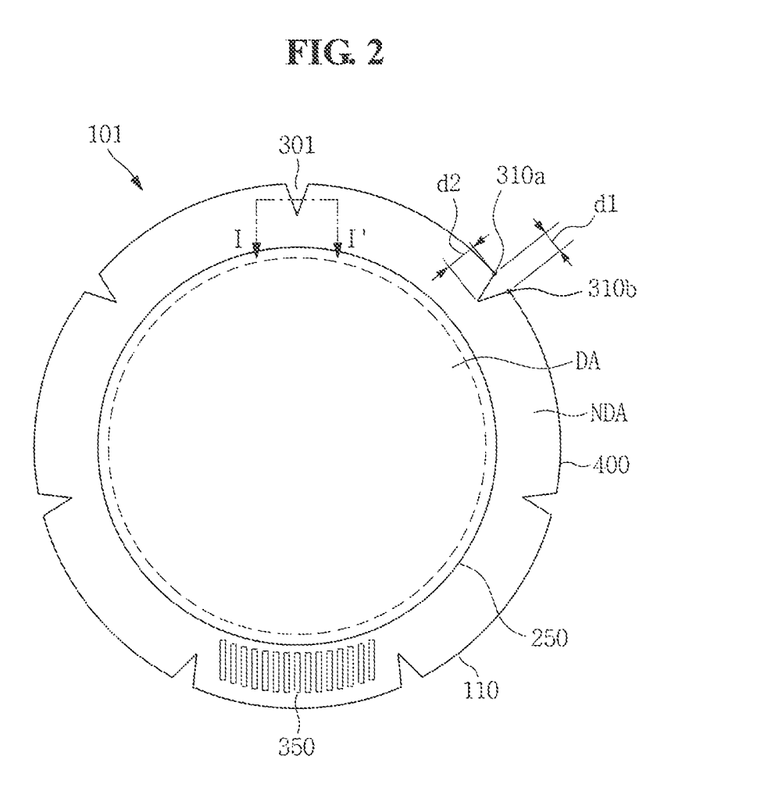
FIG. 2 is a plan view illustrating a display panel according to an exemplary embodiment.
Figure 3:
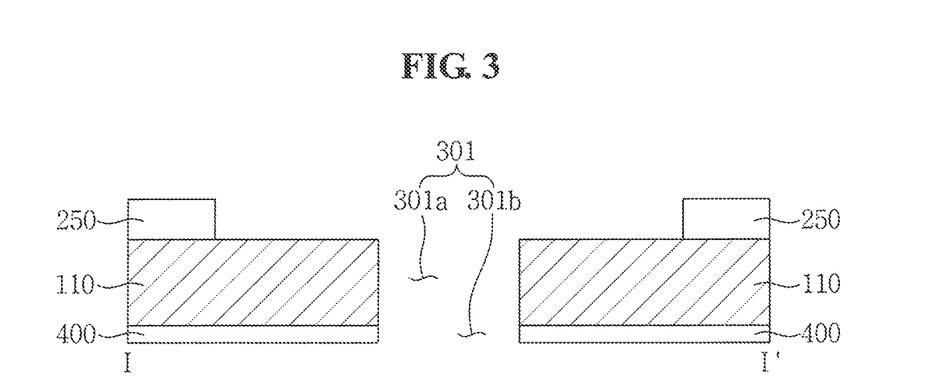
FIG. 3 is a cross-sectional view of the display panel of FIG. 2, taken along the line I-I'.

FIG. 1 is a schematic exploded perspective view illustrating a display device according to an exemplary embodiment; FIG. 2 is a plan view illustrating a display panel according to an exemplary embodiment; and FIG. 3 is a cross-sectional view of the display panel of FIG. 2, taken along the line I-I'.

Referring to FIG. 1, a display device according to an exemplary embodiment includes a display panel 101 and a window 500 on the display panel 101.

The display panel 101 may be a flexible display panel. In addition, the display panel 101 according to an exemplary embodiment has a convex dome shape, and at least a part of an edge of the display panel 101 may have a curvature on a plane. For example, the display panel 101 may have a circular shape on a plane. In an embodiment, the display panel 101 may be formed in a flat shape, and then may have a dome shape by being coupled to the window 500. The display panel 101 according to an exemplary embodiment may have a same shape or a shape substantially identical to a shape of the window 500.

The display panel 101 may include, for example, a flexible film, such as a plastic film, and may be implemented by disposing an organic light emitting diode ("OLED"), a pixel circuit, and the like on the flexible film. A further detailed configuration of the display panel 101 will be described below.

The window 500 is disposed on the display panel 101. The window 500 may be formed to have a convex dome shape.

The window 500 according to an exemplary embodiment includes a transparent hard material, thus capable of transmitting images of the display panel 101 while protecting the display panel 101 from external impact. In an embodiment, the window 500 may include a flexible film material, such as a plastic film.

Referring to FIGS. 2 and 3, the display panel 101 according to an exemplary embodiment includes a substrate 110, an encapsulation layer 250, a pad portion 350, and a protective film 400, and has a plurality of grooves 301 arranged at an outer circumferential surface of the display panel 101.

The substrate 110 is divided into a display area DA and a non-display area NDA. The display panel 101 may include a plurality of pixels (not illustrated) arranged in the display area DA to display images.

The substrate 110 may include a flexible material. Examples of the flexible material may include plastic materials. For example, the substrate 110 may include a material selected from the group consisting of: Kapton, polyethersulfone (PES), polycarbonate (PC), polyimide (PI), polyethylene terephthalate (PET), polyethylene naphthalate (PEN), polyacrylate (PAR), fiber reinforced plastic (FRP), and the like.

In an embodiment, the substrate 110 has a thickness in a range from about 5 μm to about 200 μm. In the case in which the substrate 110 has a thickness of less than about 5 μm, the substrate 110 may not stably support the OLED. On the other hand, in the case in which the substrate 110 has a thickness of more than about 200 μm, the flexible characteristics of the substrate 110 may be degraded.

The substrate 110 has a plurality of first grooves 301a arranged at an outer circumferential surface of the substrate 110. The plurality of first grooves 301a may be disposed at equal intervals along the outer circumferential surface of the substrate 110. The plurality of first grooves 301a according to an exemplary embodiment are arranged across the display area DA, and may have a triangular shape on a plane, as illustrated in FIG. 2. In an embodiment, the plurality of first grooves 301a may be defined by a mechanical cutting method. However, exemplary embodiments are not limited thereto, and the plurality of first grooves 301a may be defined through any of various methods known to those skilled in the art.

When the plurality of first grooves 301a define two edges 310a and 310b which are spaced apart from each other at the outer circumferential surface of the substrate 110, a distance d1 between the two edges 310a and 310b may be less than a depth d2 of the first groove 301a. In such an exemplary embodiment, the depth d2 of the first groove 301a may be defined as a maximum distance from a virtual central point between the two edges 310a and 310b toward the display area DA.

The encapsulation layer 250 is disposed on the display area DA of the substrate 110. In addition, the encapsulation layer 250 may be disposed in at least a part of the non-display area NDA. That is, as illustrated in FIG. 2, the encapsulation layer 250 may have a planar area greater than that of the display area DA, and may not be disposed at an edge of the substrate 110. The encapsulation layer 250 may have a planar area smaller than a planar area of the substrate 110. In the case in which the encapsulation layer 250 is disposed at an edge of the substrate 110, defects such as cracks may occur in the encapsulation layer 250 at an area adjacent to an edge of the substrate 110 when a mother substrate is cut.

In an embodiment, the encapsulation layer 250 may include one or more inorganic layers and one or more organic layers. In an embodiment, the encapsulation layer 250 may have a structure in which an inorganic layer and an organic layer are alternately stacked. Further detailed configurations of the encapsulation layer 250 will be described below.

The pad portion 350 is disposed on the substrate 110 at the non-display area NDA. The pad portion 350 receives a signal from the outside and generates a driving signal for driving the display panel 101. The external signal may include an image signal, various control signals, a driving voltage, and the like. The pad portion 350 is connected to a circuit board (not illustrated) to receive the external signal. In an embodiment, the circuit board may be a flexible printed circuit board (FPCB) having flexibility. That is, the circuit board may be disposed on at least one edge of the display panel 101, and is connected to the pad portion 350. For example, the circuit board may be electrically connected to the substrate 110 through an anisotropic conductive film.

The protective film 400 is located below the substrate 110. The protective film 400 may be attached to a lower portion of the substrate 110 through an adhesive (not illustrated). The protective film 400 may improve rigidity of the display panel 101 and prevent or substantially prevent the display panel 101 from being damaged.

The protective film 400 may include a flexible plastic material. In addition, the protective film 400 may have any of various thicknesses depending on the Young's modulus.

The protective film 400 has a plurality of second grooves 301b corresponding to the plurality of first grooves 301a. Similar to the first grooves 301a, the second grooves 301b may have a triangular shape on a plane. The protective film 400 according to an exemplary embodiment may have a shape that is the same or substantially identical to a shape of the substrate 110. The plurality of second grooves 301b may be disposed at equal intervals along an outer circumferential surface of the protective film 400. Accordingly, the display panel 101 has a plurality of grooves 301 including the plurality of first grooves 301a and the plurality of second grooves 301b at an outer circumferential surface of the display panel 101.

Similar to the plurality of first grooves 301a, when the plurality of second grooves 301b define two edges which are spaced apart from each other at the outer circumferential surface of the protective film 400, a distance between the two edges may be less than a depth of the second groove 301b. In such an exemplary embodiment, the depth of the second groove 301b may be defined as a maximum distance from a virtual central point between the two edges toward the display area DA.

In an embodiment, the plurality of second grooves 301b may be defined by a mechanical cutting method. In an embodiment, the plurality of second grooves 301b may be defined substantially concurrently (e.g., simultaneously) with the plurality of first grooves 301a in a substantially same process. However, exemplary embodiments are not limited thereto, and each of the plurality of first grooves 301a and the plurality of second grooves 301b may be defined through any of various methods known to those skilled in the art.

As described above, the display panel 101 may be formed into a flat shape, and then may have a dome shape by being coupled to the window 500. That is, in order to form a dome-shaped display device, a laminating process may be performed to press the display panel 101 and the window 500. In such an exemplary embodiment, the grooves 301 may be deformed in size and shape after the laminating process of the display panel 101. For example, after the laminating process, the grooves 301 may be reduced in size on a plane, or inner side surfaces of the grooves 301 may contact each other.

As the display panel 101 according to an exemplary embodiment has the plurality of grooves 301 arranged at an outer circumferential surface of the display panel 101, a stress caused by deformation of the display panel 101 during the laminating process may be reduced. Accordingly, defects, such as cracks, shrinkage, and bubbles, that may occur at an edge area of the display panel 101 may be prevented or substantially prevented.

Figure 4:
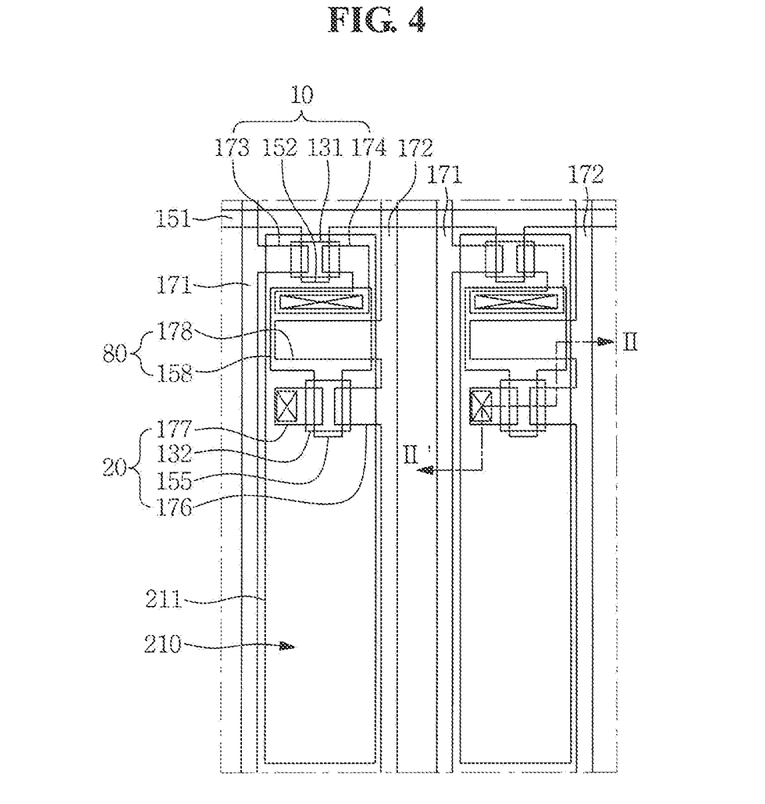
FIG. 4 is a partial enlarged view illustrating a part of the display panel, according to an exemplary embodiment.
Figure 5:
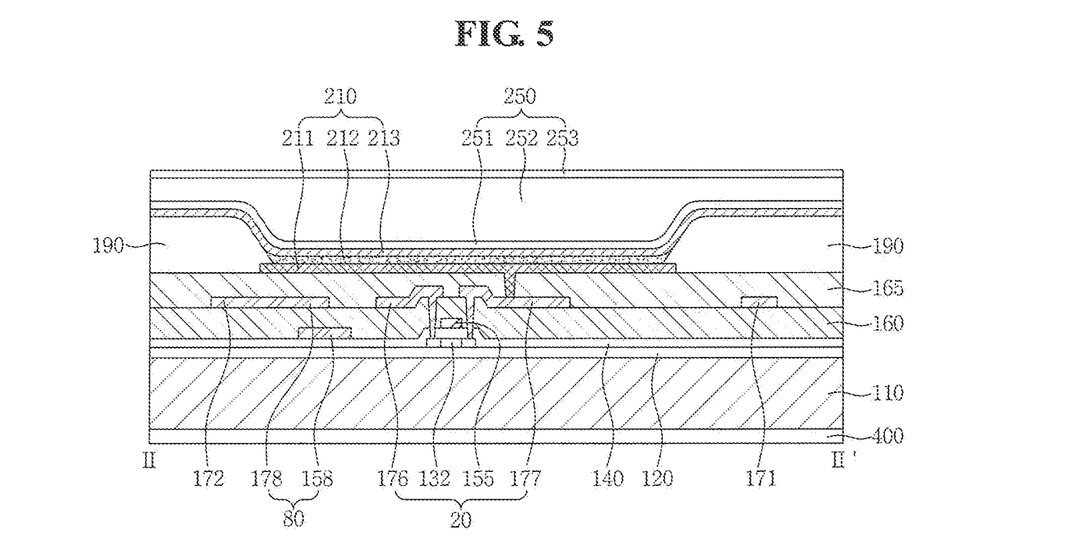
FIG. 5 is a cross-sectional view taken along the line II-II' of FIG. 4.

FIG. 4 is a partial enlarged view illustrating a part of the display panel, according to an exemplary embodiment; and FIG. 5 is a cross-sectional view taken along the line II-II' of FIG. 4.

Referring to FIGS. 4 and 5, the display panel 101 according to an exemplary embodiment includes a plurality of pixels which include a switching thin film transistor ("TFT") 10, a driving TFT 20, a capacitor 80, and an OLED 210 disposed at the display area DA. The OLED 210 may be mainly applied to flexible display devices because it may be deposited at a relatively low temperature and has a relatively low power consumption, a relatively high luminance, and the like. As used herein, the term "pixel" refers to a smallest unit for displaying images, and the display panel 101 displays images using the plurality of pixels.

Although it is depicted in the drawings that each pixel includes two TFTs and one capacitor, exemplary embodiments are not limited thereto. For example, each pixel may include three or more TFTs and two or more capacitors and may further include additional wirings to have various structures.

The display panel 101 includes a substrate 110, a gate line 151 on the substrate 110, a data line 171 and a common power line 172 insulated from and intersecting the gate line 151. In general, each pixel may be defined by the gate line 151, the data line 171, and the common power line 172 in which they become a boundary, but the pixel is not limited to the above definition. In an exemplary embodiment, the pixels may be defined by a pixel defining layer 190 or a black matrix (not illustrated).

The substrate 110 may include a flexible material. An example of the flexible material may include a plastic material. For example, the substrate 110 may include at least one material selected from the group consisting of: Kapton, polyethersulfone (PES), polycarbonate (PC), polyimide (PI), polyethylene terephthalate (PET), polyethylene naphthalate (PEN), polyacrylate (PAR), fiber reinforced plastic (FRP), and the like.

In an embodiment, the substrate 110 may have a thickness in a range from about 5 μm to about 200 μm. In the case in which the substrate 110 has a thickness less than about 5 μm, it is difficult for the substrate 110 to stably support the OLED 210. On the other hand, in the case in which the substrate 110 has a thickness of about 200 μm or more, the flexible characteristics of the substrate 110 may be degraded.

A buffer layer 120 is disposed on the substrate 110. The buffer layer 120 is configured to prevent or substantially prevent permeation of undesirable elements and to planarize a surface therebelow, and may include any of suitable materials for preventing or substantially preventing permeation and/or planarizing. For example, the buffer layer 120 may include any of the following: a silicon nitride ($SiN_x$) layer, a silicon oxide ($SiO_2$) layer, and a silicon oxynitride ($SiO_xN_y$) layer. However, the buffer layer 120 is not invariably necessary and may be omitted based on the kind of the substrate 110 and process conditions thereof.

A switching semiconductor layer 131 and a driving semiconductor layer 132 are disposed on the buffer layer 120. The switching semiconductor layer 131 and the driving semiconductor layer 132 may include at least one of the following: a polycrystalline silicon layer, an amorphous silicon layer, and an oxide semiconductor, such as indium gallium zinc oxide (IGZO) and indium zinc tin oxide (IZTO). For example, in the case in which the driving semiconductor layer 132 includes a polycrystalline silicon layer, the driving semiconductor layer 132 includes a channel area which is not doped with impurities and p+ doped source and drain areas which are formed on opposite sides of the channel area. In such an exemplary embodiment, p-type impurities, such as boron B, may be used as dopant ions, and $B_2H_6$ is typically used. Such impurities may vary depending on the kinds of TFTs. The driving TFT 20 according to an exemplary embodiment uses a p-channel metal oxide semiconductor (PMOS) TFT including p-type impurities, but exemplary embodiments are not limited thereto. Alternatively, the driving TFT 20 may use an n-channel metal oxide semiconductor (NMOS) TFT or a complementary metal oxide semiconductor (CMOS) TFT.

A gate insulating layer 140 is disposed on the switching semiconductor layer 131 and the driving semiconductor layer 132. The gate insulating layer 140 may include at least one of: tetraethyl orthosilicate (TEOS), silicon nitride ($SiN_x$), and silicon oxide ($SiO_2$). For example, the gate insulating layer 140 may have a double-layer structure where a $SiN_x$ layer having a thickness of about 40 nm and a TEOS layer having a thickness of about 80 nm are sequentially stacked.

A gate wiring, which includes gate electrodes 152 and 155, is disposed on the gate insulating layer 140. The gate wiring further includes the gate line 151, a first capacitor plate 158, and other wirings. In addition, the gate electrodes 152 and 155 are disposed to overlap at least a portion of the semiconductor layers 131 and 132, for example, a channel area thereof. The gate electrodes 152 and 155 serve to prevent or substantially prevent the channel area from being doped with impurities when the source and drain areas of the semiconductor layers 131 and 132 are doped with impurities during the process of forming the semiconductor layers 131 and 132.

The gate electrodes 152 and 155 and the first capacitor plate 158 are disposed on a same or substantially same layer and include a same or substantially same metal material. In an embodiment, the gate electrodes 152 and 155 and the first capacitor plate 158 may include at least one of molybdenum (Mo), chromium (Cr), and tungsten (W).

An insulating interlayer 160 is disposed on the gate insulating layer 140 to overlap the gate electrodes 152 and 155. The insulating interlayer 160, similar to the gate insulating layer 140, may include or be formed of silicon nitride (SiNx), silicon oxide (SiOx), tetraethoxysilane (TEOS), or the like, but exemplary embodiments are not limited thereto.

A data wiring which includes source electrodes 173 and 176 and drain electrodes 174 and 177 is disposed on the insulating interlayer 160. The data wiring further includes the data line 171, the common power line 172, a second capacitor plate 178, and other wirings. In addition, the source electrodes 173 and 176 and the drain electrodes 174 and 177 are connected to the source and drain areas of the semiconductor layers 131 and 132, respectively, through a contact hole defined at the gate insulating layer 140 and the insulating interlayer 160.

As such, the switching TFT 10 includes the switching semiconductor layer 131, the switching gate electrode 152, the switching source electrode 173, and the switching drain electrode 174, and the driving TFT 20 includes the driving semiconductor layer 132, the driving gate electrode 155, the driving source electrode 176, and the driving drain electrode 177. However, configurations of the TFTs 10 and 20 are not limited to the above embodiments, and thus may be modified into various structures that are known to and may be easily conceived by those skilled in the pertinent art.

In addition, the capacitor 80 includes the first capacitor plate 158 and the second capacitor plate 178 with the insulating interlayer 160 interposed therebetween.

The switching TFT 10 may function as a switching element to select pixels to perform light emission. The switching gate electrode 152 is connected to the gate line 151. The switching source electrode 173 is connected to the data line 171. The switching drain electrode 174 is spaced apart from the switching source electrode 173 and is connected to the first capacitor plate 158.

The driving TFT 20 applies, to a pixel electrode 211, a driving power which allows a light emitting layer 212 of an OLED 210 in the selected pixel to emit light. The driving gate electrode 155 is connected to the first capacitor plate 158. Each of the driving source electrode 176 and the second capacitor plate 178 is connected to the common power line 172. The driving drain electrode 177 is connected to the pixel electrode 211 of the OLED 210 through a contact hole.

With the aforementioned structure, the switching TFT 10 is driven by a gate voltage applied to the gate line 151 and serves to transmit a data voltage applied to the data line 171 to the driving TFT 20. A voltage equivalent to a difference between a common voltage applied to the driving TFT 20 from the common power line 172 and the data voltage transmitted from the switching TFT 10 is stored in the capacitor 80, and a current corresponding to the voltage stored in the capacitor 80 flows to the OLED 210 through the driving TFT 20, such that the OLED 210 may emit light.

A planarization layer 165 is disposed to cover the data wiring, e.g., the data line 171, the common power line 172, the source electrodes 173 and 176, the drain electrodes 174 and 177, and the second capacitor plate 178, which are patterned into a same or substantially same layer on the insulating interlayer 160.

The planarization layer 165 serves to eliminate or substantially eliminate a step difference and planarize a surface therebelow so as to increase luminous efficiency of the OLED 210 to be formed thereon. The planarization layer 165 may include at least one of the following materials: a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

The pixel electrode 211 of the OLED 210 is disposed on the planarization layer 165. The pixel electrode 211 is connected to the drain electrode 177 through a contact hole defined at the planarization layer 165.

The pixel defining layer 190 exposing at least a portion of the pixel electrode 211 to define a pixel area is disposed on the planarization layer 165. The pixel electrode 211 is disposed corresponding to the pixel area of the pixel defining layer 190. The pixel defining layer 190 may include a resin, such as a polyacrylate resin and a polyimide resin.

In the pixel area, the light emitting layer 212 is disposed on the pixel electrode 211, and a common electrode 213 is disposed on the pixel defining layer 190 and the light emitting layer 212. The light emitting layer 212 includes a low molecular organic material or a high molecular organic material. At least one of a hole injection layer HIL and a hole transport layer HTL may further be disposed between the pixel electrode 211 and the light emitting layer 212, and at least one of an electron transport layer ETL and an electron injection layer EIL may further be disposed between the light emitting layer 212 and the common electrode 213.

The pixel electrode 211 and the common electrode 213 may be formed as one of a transmissive electrode, a transflective electrode, and a reflective electrode.

In an embodiment, a transparent conductive oxide ("TCO") may be used to form a transmissive electrode. Such a TCO may include at least one selected from the group consisting of: indium tin oxide (ITO), indium zinc oxide (IZO), zinc oxide (ZnO), and indium oxide ($In_2O_3$).

A metal, e.g., magnesium (Mg), silver (Ag), gold (Au), calcium (Ca), lithium (Li), chromium (Cr), aluminum (Al), and copper (Cu), or an alloy thereof may be used to form a transflective electrode and a reflective electrode. In such an exemplary embodiment, whether an electrode is a transflective type or a reflective type depends on the thickness of the electrode. Typically, the transflective electrode has a thickness of about 200 nm or less and the reflective electrode has a thickness of about 300 nm or more. As the thickness of the transflective electrode decreases, light transmittance and resistance increase. On the contrary, as the thickness of the transflective electrode increases, light transmittance decreases.

In an embodiment, the transflective electrode and the reflective electrode may have a multilayer structure which includes a metal layer including a metal or a metal alloy and a TCO layer stacked on the metal layer.

An encapsulation layer 250 is disposed on the common electrode 213. In an embodiment, the encapsulation layer 250 includes one or more inorganic layers 251 and 253 and one or more organic layers 252. In an embodiment, the encapsulation layer 250 may have a structure in which one or more inorganic layers 251 and 253 and one or more organic layers 252 are alternately stacked. In such an exemplary embodiment, an inorganic layer 251 is disposed at a lowermost portion. That is, the inorganic layer 251 is disposed most adjacent to the OLED 210.

The encapsulation layer 250 is depicted as including two inorganic layers 251 and 253 and one organic layer 252, but exemplary embodiments are not limited thereto.

The inorganic layers 251 and 253 may include one or more inorganic materials selected from the group consisting of: $Al_2O_3$, $TiO_2$, ZrO, $SiO_2$, AlON, AlN, SiON, $Si_3N_4$, ZnO, and $Ta_2O_5$. The inorganic layers 251 and 253 may be formed through methods such as a chemical vapor deposition (CVD) method or an atomic layer deposition (ALD) method. However, exemplary embodiments are not limited thereto, and the inorganic layers 251 and 253 may be formed using any of various methods known to those skilled in the art.

The organic layer 252 may include a polymer-based material. Examples of the polymer-based material may include, for example, an acrylic resin, an epoxy resin, polyimide, and polyethylene. In an embodiment, the organic layer 252 may be formed through a thermal deposition process. In addition, the thermal deposition process for forming the organic layer 252 may be performed within the temperature range that may not damage the OLED 210. However, exemplary embodiments are not limited thereto, and the organic layer 252 may be formed using any of various methods known to those skilled in the pertinent art.

The inorganic layers 251 and 253 which have a high density of thin film may prevent or substantially prevent or efficiently reduce permeation of, mostly, moisture or oxygen. Permeation of moisture and oxygen into the OLED 210 may be prevented or largely prevented by the inorganic layers 251 and 253.

The encapsulation layer 250 may have a thickness less than or equal to about 10 μm. Accordingly, the OLED display panel may have a significantly small thickness. By applying such an encapsulation layer 250, the flexible characteristics of the display panel 101 may be improved or optimized.

The protective film 400 is located below the substrate 110. The protective film 400 may be attached to a lower portion of the substrate 110 through an adhesive (not illustrated). The protective film 400 may improve rigidity of the display panel 101 and prevent or substantially prevent the display panel 101 from being damaged.

The protective film 400 may include a flexible plastic material. In addition, the protective film 400 may have any of various thicknesses depending on the Young's modulus. The protective film 400 according to an exemplary embodiment may have a same shape or a shape substantially identical to a shape of the substrate 110.

Herein, some other exemplary embodiments will be described with reference to FIGS. 6A, 6B, 6C, and 6D. The descriptions of configurations substantially the same as those of the above-described exemplary embodiment of the present invention will be omitted for the convenience of explanation.

FIGS. 6A, 6B, 6C, and 6D are plan views illustrating display panels according to some other exemplary embodiments.

Figure 6A:
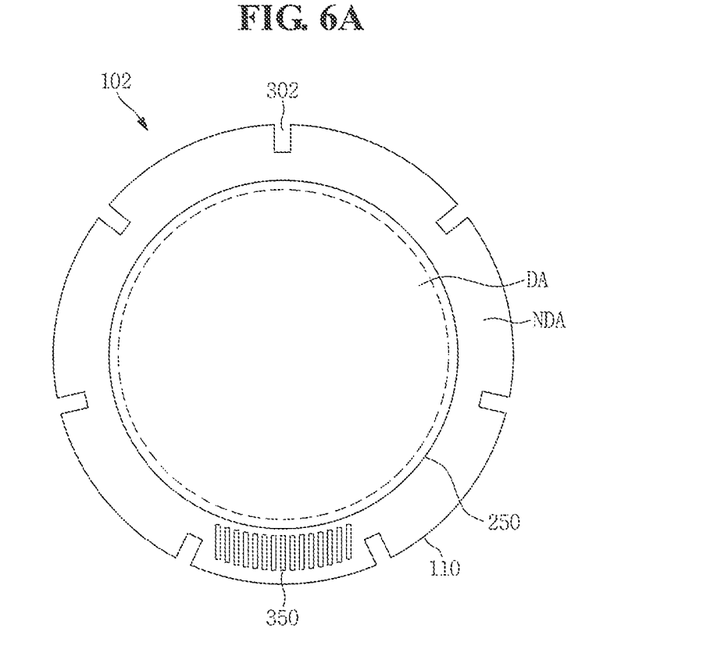
FIGS. 6A, 6B, 6C, and 6D are plan views illustrating display panels according to some other exemplary embodiments.
Figure 6B:
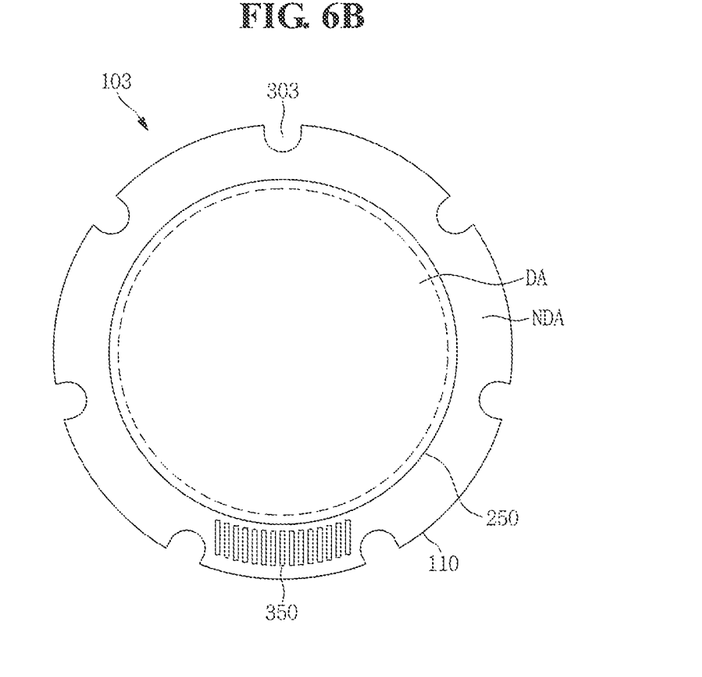
Figure 6C:
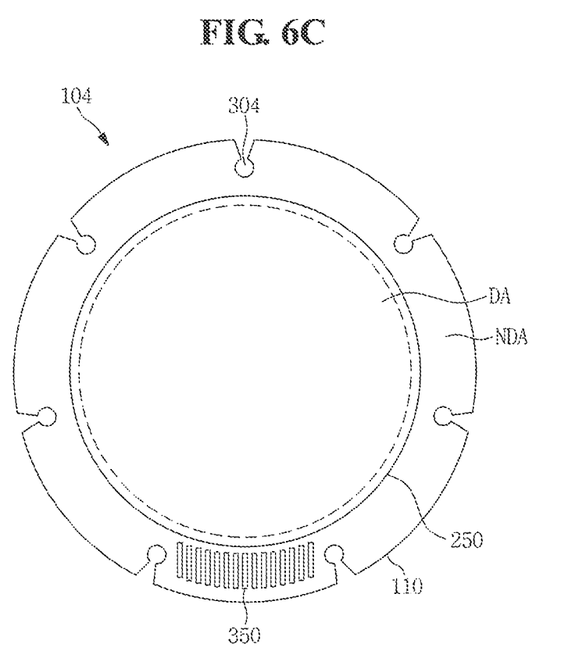

Referring to FIGS. 6A, 6B, and 6C, display panels 102, 103, and 104 according to some other exemplary embodiments may have a plurality of grooves 302, 303, and 304 having various shapes and arranged at an outer circumferential surface thereof. For example, as illustrated in FIGS. 6A, 6B, and 6C, the plurality of grooves 302, 303, and 304 may be formed in a quadrangular shape, a semicircular shape, or a combined shape of a triangle and a circle on a plane. In addition, although each of the plurality of grooves 302, 303, and 304 within each embodiment is depicted as having a same or substantially identical shape and a same or substantially equal size regardless of its location, exemplary embodiments are not limited thereto. That is, the grooves 302, 303, and 304 within each embodiment may have different shapes and sizes depending on their locations. That is, the shape, the size, the number, and the like of the plurality of grooves 302, 303, and 304 may be varied to meet various process requirements.

Figure 6D:
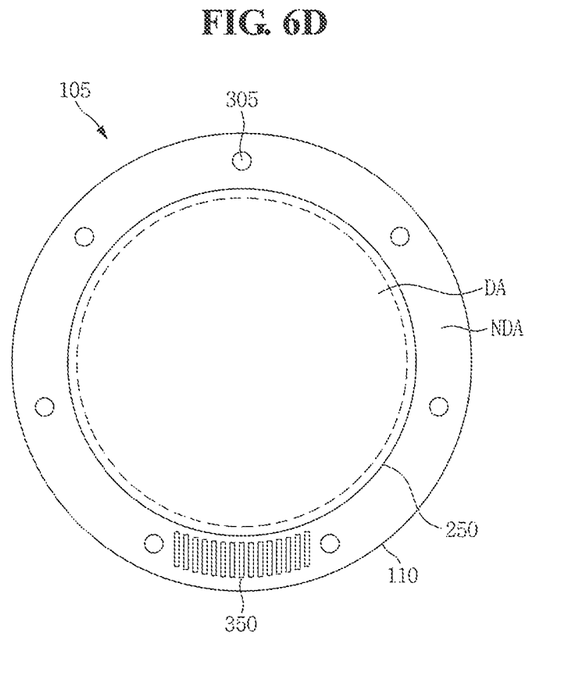

Referring to FIG. 6D, a display panel 105 may have a plurality of holes 305 arranged in a non-display area NDA of a substrate 110. In an embodiment, the plurality of holes 305 passing through the substrate 110 and a protective film 400 may be disposed apart from an outer circumferential surface of the display panel 105. The plurality of holes 305 may be arranged across the display area DA. The plurality of holes 305 are depicted as having a circular shape on a plane, but exemplary embodiments are not limited thereto. In an embodiment, the holes 305 may have at least one of an elliptical shape, a semicircular shape, a polygonal shape, and a combined shape thereof.

The display panels 102, 103, 104, and 105 according to some other exemplary embodiments may have the plurality of grooves 302, 303, and 304 or the plurality of holes 305 having various shapes such that a stress caused by deformation of the display panels 102, 103, 104, and 105 may be reduced. Accordingly, defects, such as cracks, shrinkage, and bubbles, that may occur at an edge area of the display panel may be prevented or substantially prevented.

Herein, some other exemplary embodiments will be described with reference to FIGS. 7A and 7B. The descriptions of configurations substantially the same as those of the above-described exemplary embodiments of the present invention will be omitted for the convenience of explanation.

Figure 7A:
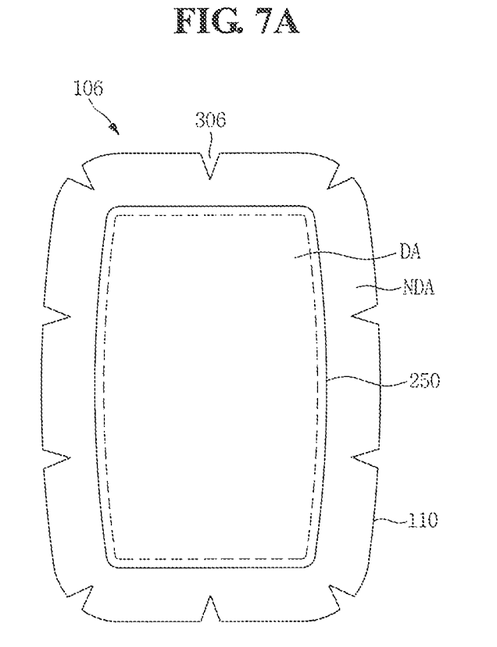
FIGS. 7A and 7B are plan views illustrating display panels according to some other exemplary embodiments.
Figure 7B:
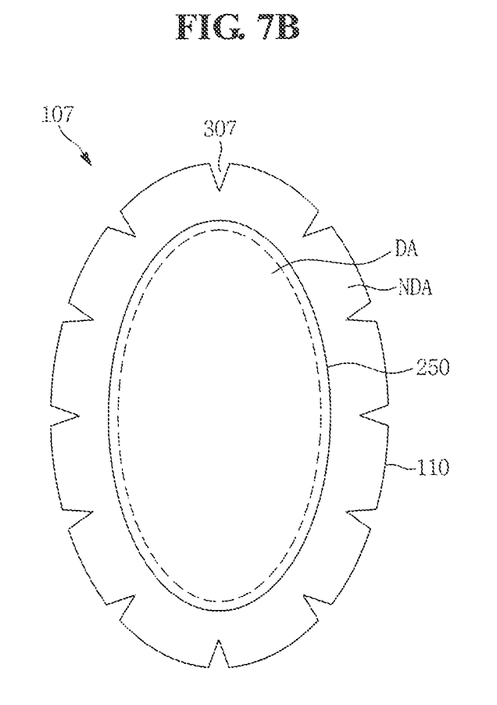

FIGS. 7A and 7B are plan views illustrating display panels according to some other exemplary embodiments. For ease of description, a pad portion is omitted.

Referring to FIGS. 7A and 7B, display panels 106 and 107 according to some other exemplary embodiments may have various shapes on a plane. At least a part of an edge of the display panels 106 and 107 may have a curvature on a plane. For example, as illustrated in FIGS. 7A and 7B, at least a part of the edge of the display panels 106 and 107 may be formed in the shape of a quadrangle or an ellipse that has a curvature on a plane. However, exemplary embodiments are not limited thereto, and at least a part of the edge of the display panels 106 and 107 may have any of various shapes having a curvature on a plane.

In an embodiment, the display panels 106 and 107 may be formed in a flat shape, and then may have a dome shape by being coupled to a window 500. The display panels 106 and 107 according to some other exemplary embodiments may have a same shape or a shape substantially identical to a shape of the window 500.

The display panels 106 and 107 have pluralities of grooves 306 and 307, respectively, which are arranged at an outer circumferential surface of the display panels 106 and 107. Although the grooves 306 and 307 are depicted as having a triangular shape on a plane, exemplary embodiments are not limited thereto. The grooves 306 and 307 may have at least one of a circular shape, an elliptical shape, a semicircular shape, a polygonal shape, and a combined shape thereof.

Accordingly, a stress caused by deformation of the display panels 106 and 107 during a laminating process may be reduced, and defects, such as cracks, shrinkage, and bubbles, that may occur at an edge area of the display panels 106 and 107 may be prevented or substantially prevented.

Herein, another exemplary embodiment will be described with reference to FIGS. 8 and 9. The descriptions of configurations substantially the same as those of the above-described exemplary embodiments of the present invention will be omitted for the convenience of explanation.

Figure 8:
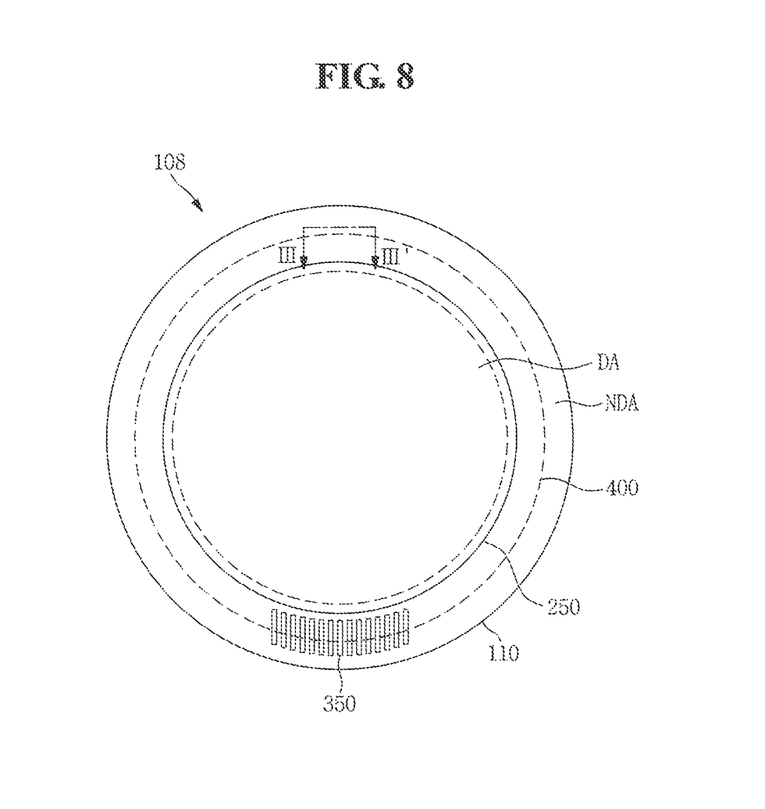
FIG. 8 is a plan view illustrating a display panel according to another exemplary embodiment.
Figure 9:
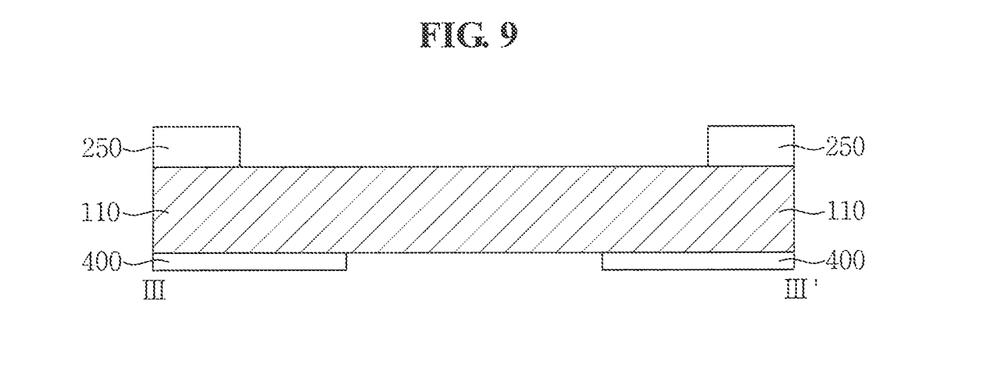
FIG. 9 is a cross-sectional view of the display panel of FIG. 8, taken along the line III-III'.

FIG. 8 is a plan view illustrating a display panel according to another exemplary embodiment; and FIG. 9 is a cross-sectional view of the display panel of FIG. 8, taken along the line III-III'.

Referring to FIGS. 8 and 9, a display panel 108 according to another exemplary embodiment includes a substrate 110, an encapsulation layer 250, a pad portion 350, and a protective film 400.

The protective film 400 is located below the substrate 110. The protective film 400 may be attached to a lower portion of the substrate 110 through an adhesive (not illustrated). The protective film 400 may improve rigidity of the display panel 108 and prevent or substantially prevent the display panel 108 from being damaged.

The protective film 400 according to an exemplary embodiment has a planar area smaller than a planar area of the substrate 110. As illustrated in FIGS. 8 and 9, the protective film 400 may be disposed apart from an outer circumferential surface of the substrate 110 of the display panel 108.

The protective film 400 according to an exemplary embodiment is not disposed at an edge area of the display panel 108, thereby reducing a stress caused by deformation of the display panel 108 during a laminating process. Accordingly, defects, such as cracks, shrinkage, and bubbles, that may occur at an edge area of the display panel may be prevented or substantially prevented.

Herein, another alternative exemplary embodiments will be described with reference to FIGS. 10 and 11. The descriptions of configurations substantially the same as those of the above-described exemplary embodiments of the present invention will be omitted for the convenience of explanation.

Figure 10:
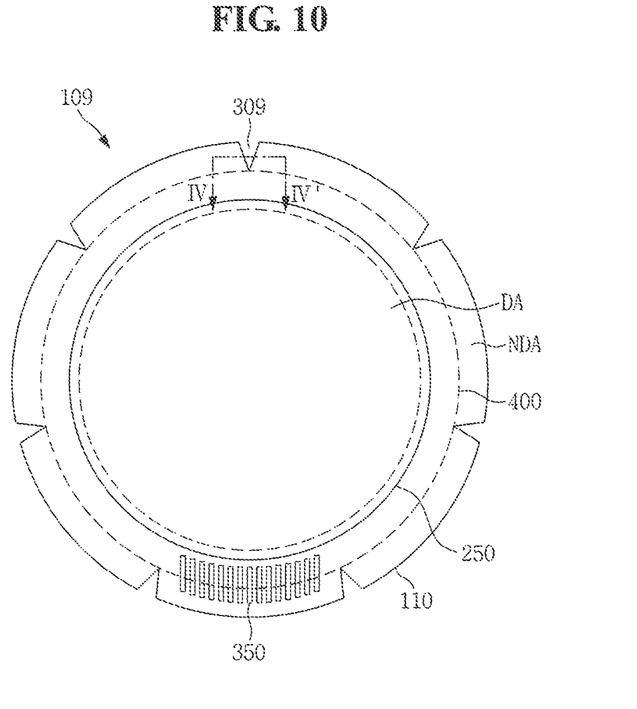
FIG. 10 is a plan view illustrating a display panel according to another exemplary embodiment.
Figure 11:
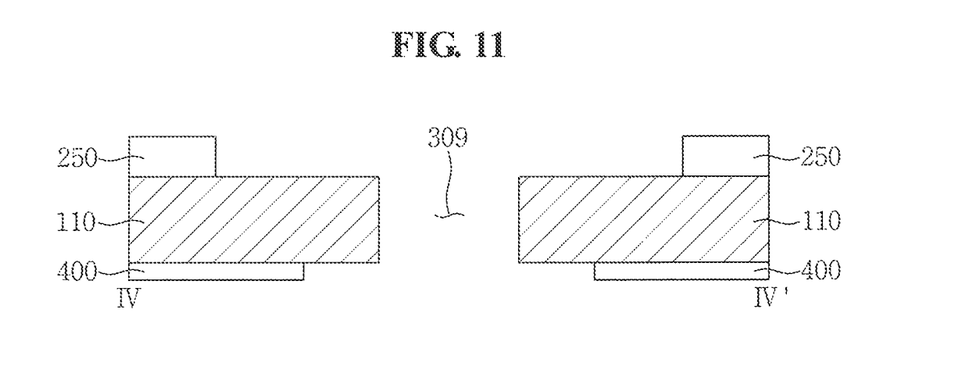
FIG. 11 is a cross-sectional view of the display panel of FIG. 10, taken along the line IV-IV'.

FIG. 10 is a plan view illustrating a display panel according to another exemplary embodiment; and FIG. 11 is a cross-sectional view of the display panel of FIG. 10, taken along the line IV-IV'.

Referring to FIGS. 10 and 11, a display panel 109 according to another exemplary embodiment includes a substrate 110, an encapsulation layer 250, a pad portion 350, and a protective film 400, and has a plurality of grooves 309 arranged at an outer circumferential surface of the display panel 109.

The substrate 110 has the plurality of grooves 309 arranged at an outer circumferential surface of the substrate 110. The grooves 309 according to an exemplary embodiment are depicted as having a triangular shape on a plane, but exemplary embodiments are not limited thereto. The plurality of grooves 309 may have at least one of a circular shape, an elliptical shape, a semicircular shape, a polygonal shape, and a combined shape thereof.

The protective film 400 is located below the substrate 110. In an embodiment, the protective film 400 may be attached to a lower portion of the substrate 110 through an adhesive (not shown). The protective film 400 may serve to improve rigidity of the display panel 109 and prevent or substantially prevent the display panel 109 from being damaged.

In addition, the protective film 400 according to an exemplary embodiment has a planar area less than a planar area of the substrate 110. The protective film 400 may be disposed apart from an outer circumferential surface of the display panel 109, as illustrated in FIGS. 10 and 11.

The display panel 109 according to an exemplary embodiment has the plurality of grooves 309 arranged at an outer circumferential surface of the display panel 109, and the protective film 400 is not provided at an edge area of the display panel 109. Accordingly, a stress caused by deformation of the display panel 109 during the laminating process may be reduced, and defects, such as cracks, shrinkage, and bubbles, that may occur at an edge area of the display panel 109 may be prevented or substantially prevented.

As set forth herein, according to one or more exemplary embodiments, a stress due to deformation of the display panel may be reduced, and thus the reliability of the display device may be improved.

While the present invention has been illustrated and described with reference to some exemplary embodiments thereof, it will be apparent to those of ordinary skill in the art that various changes in form and detail may be made thereto without departing from the spirit and scope of the present invention.

What is claimed is:

1. A display device comprising:
   a display panel comprising a substrate and an encapsulation layer, the substrate comprising a display area and a non-display area, and the encapsulation layer being located on the substrate at the display area; and
   a window on the display panel, the window at least partially having a first shape curved in a first direction and a second direction perpendicular to the first direction,
   wherein the substrate at least partially has a second shape corresponding to the first shape of the window, and has a plurality of first grooves arranged at an outer circumference of the substrate, the outer circumference having the second shape, and
   wherein the plurality of first grooves pass completely through the substrate in a thickness direction of the substrate and overlap with a portion of the window having the first shape in the thickness direction of the substrate.

2. The display device of claim 1, wherein the display panel has a circular shape, an elliptical shape, or a polygonal shape on a plane.

3. The display device of claim 2, wherein each of the first shape and the second shape is a dome shape.

4. The display device of claim 1, wherein a distance between two edges defined by the first groove at the outer circumference of the substrate is less than a depth of the first groove on a plane.

5. The display device of claim 1, wherein each of the plurality of first grooves is disposed at equal intervals along the outer circumference of the substrate.

6. The display device of claim 1, wherein each of the plurality of first grooves has at least one of a circular shape, an elliptical shape, a semicircular shape, a polygonal shape, and a combined shape thereof on a plane.

7. The display device of claim 1, wherein the plurality of first grooves are arranged across the display area.

8. The display device of claim 1, wherein the display panel further comprises a protective film below the substrate.

9. The display device of claim 8, wherein the protective film has a plurality of second grooves.

10. The display device of claim 9, wherein the plurality of second grooves correspond to the plurality of first grooves, respectively.

11. The display device of claim 9, wherein a distance between two edges defined by the second groove at an outer circumference of the protective film is less than a depth of the second groove on a plane.

12. The display device of claim 9, wherein each of the plurality of second grooves is disposed at equal intervals.

13. The display device of claim 9, wherein the protective film has a same shape as a shape of the substrate.

14. The display device of claim 8, wherein the protective film has a planar area smaller than a planar area of the substrate.

15. The display device of claim 1, wherein the encapsulation layer has a planar area smaller than a planar area of the substrate.

16. A display device comprising:
a display panel comprising a substrate and an encapsulation layer, the substrate comprising a display area and a non-display area, and the encapsulation layer being located on the substrate at the display area; and
a window on the display panel, the window at least partially having a first shape curved in a first direction and a second direction perpendicular to the first direction,
wherein the substrate at least partially has a second shape corresponding to the first shape of the window, and has a plurality of holes arranged at the non-display area having the second shape, the holes being spaced apart from a periphery of the substrate and being open while passing through the substrate, and
the plurality of holes overlap with a portion of the window having the first shape in a thickness direction of the substrate.

17. The display device of claim 16, wherein the display panel has a circular shape, an elliptical shape, or a polygonal shape on a plane.

18. The display device of claim 17, wherein each of the first and second shapes is a dome shape.

19. The display device of claim 16, wherein each of the plurality of holes has at least one of a circular shape, an elliptical shape, a semicircular shape, a polygonal shape, and a combined shape thereof on a plane.

20. The display device of claim 16, wherein the plurality of holes are arranged across the display area.

21. The display device of claim 16, wherein the display panel further comprises a protective film below the substrate.

22. The display device of claim 21, wherein the protective film has a same shape as a shape of the substrate.

23. The display device of claim 21, wherein the protective film has a planar area smaller than a planar area of the substrate.

24. A display device comprising:
a display panel comprising a substrate, an encapsulation layer, and a protective film, the substrate comprising a display area and a non-display area, the encapsulation layer being located on the substrate at the display area, and the protective film being located below the substrate; and
a window on the display panel, the window at least partially having a first shape curved in a first direction and a second direction perpendicular to the first direction,
wherein the substrate at least partially has a second shape corresponding to the first shape of the window,
the protective film has an outer periphery and a thickness at the outer periphery in a thickness direction of the substrate, the outer periphery being spaced inwardly from an outer periphery of the substrate in a direction perpendicular to the thickness direction of the substrate such that a planar area of the protective film is smaller than a planar area of the substrate and is larger than a planar area of the display area, the outer periphery of the substrate having the second shape, and
the outer periphery of the protective film overlaps with a portion of the window having the first shape in the thickness direction of the substrate.

25. The display device of claim 24, wherein the protective film is arranged apart from an outer circumference of the substrate.

26. The display device of claim 24, wherein the display panel has a circular shape, an elliptical shape, or a polygonal shape on a plane.

27. The display device of claim 26, wherein each of the first shape and the second shape has a dome shape.

* * * * *